United States Patent [19]

Peterson

[11] Patent Number: 6,026,013

[45] Date of Patent: Feb. 15, 2000

[54] QUANTUM RANDOM ADDRESS MEMORY

[75] Inventor: William M. Peterson, Chandler, Ariz.

[73] Assignee: Motorola, Inc., Schaumburg, Ill.

[21] Appl. No.: 09/163,877

[22] Filed: Sep. 30, 1998

[51] Int. Cl.[7] .................................................. G11C 11/36
[52] U.S. Cl. .......................................... 365/175; 365/151
[58] Field of Search .................................... 365/171, 151, 365/153, 158, 148, 175

[56] References Cited

U.S. PATENT DOCUMENTS

| 4,725,791 | 2/1988 | Susak et al. | 330/261 |
| 5,323,344 | 6/1994 | Katayama et al. | 365/162 |
| 5,614,435 | 3/1997 | Petroff et al. | 437/110 |

OTHER PUBLICATIONS

"Pulse Current Trimming of Polysilicon Resistors", Feldbaumer et al., IEEE Transactions on Electron Devices, vol. 42, No. 4, Apr. 1995, pp. 689–696.

"Theory and Application of Polysilicon Resistor Trimming", Feldbaumer et al., Solid–State Electronics, vol. 38, No. 11, 1995, pp. 1861–1869.

*Primary Examiner*—David Lam
*Attorney, Agent, or Firm*—Eugene A. Parsons; William E. Koch

[57] ABSTRACT

Quantum random address memory apparatus including a low dimensional plurality of address ports, a plurality of nano-memory elements, mixer elements coupling the address ports to a high dimensional plurality of the plurality of nano-memory elements, and data output ports and structure coupled to the plurality of nano-memory elements. The high dimensional plurality of nano-memory elements is greater than the low dimensional plurality of address ports by a number resulting in substantially error free memory recalls.

24 Claims, 8 Drawing Sheets

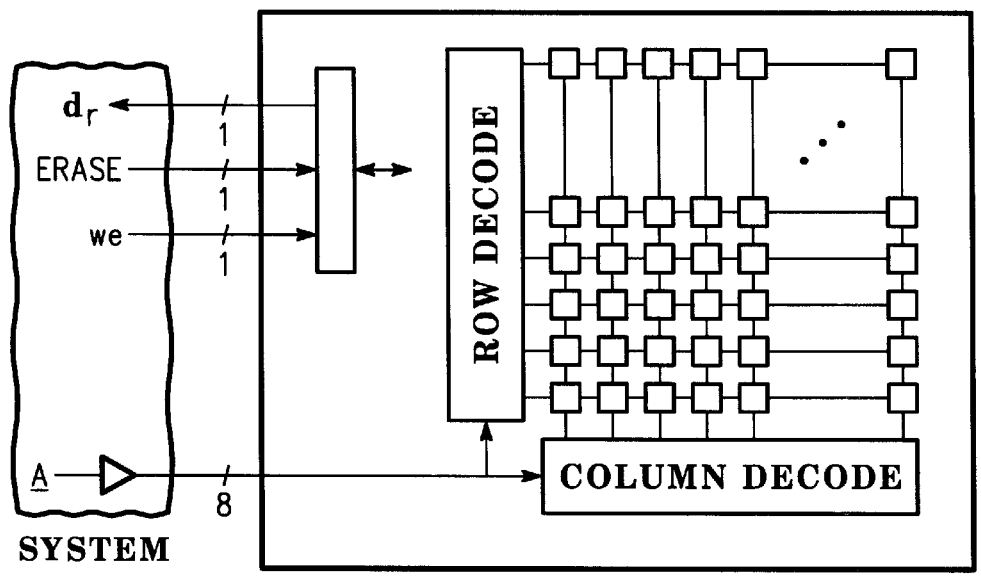
*- PRIOR ART -* FIG. 1
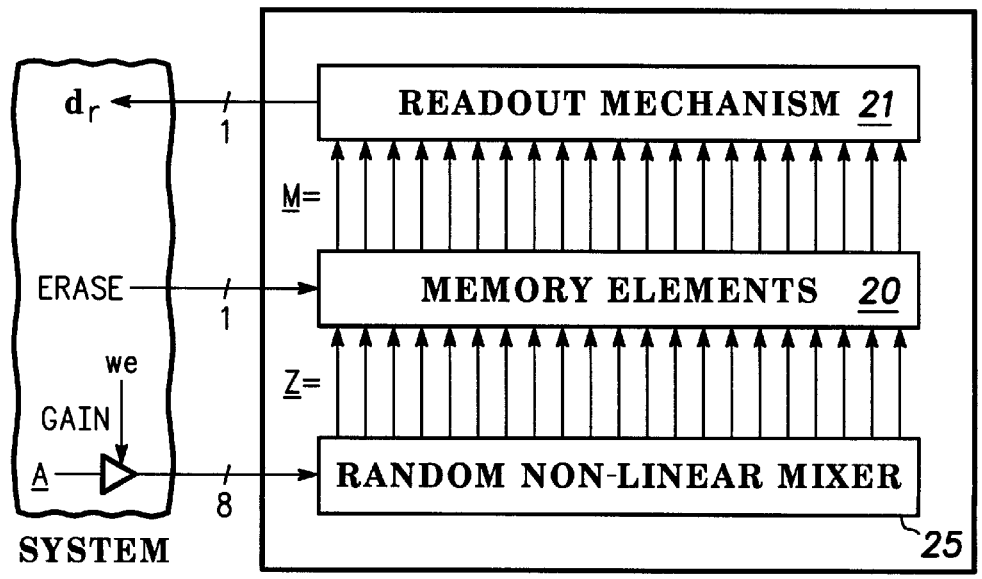
*10*  FIG. 2

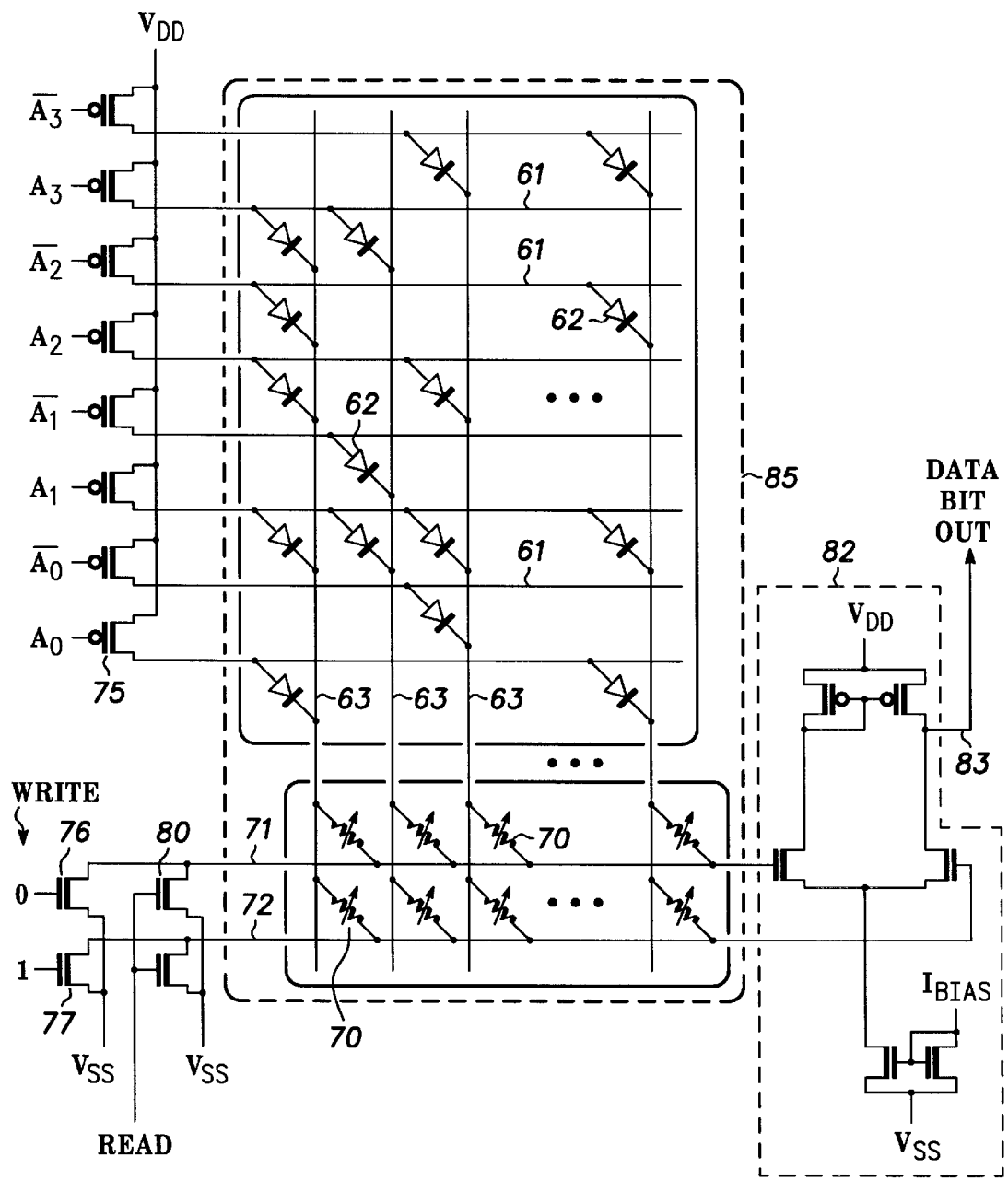
60 FIG. 10

QUANTUM RANDOM ADDRESS MEMORY

FIELD OF THE INVENTION

The present invention pertains to memory apparatus and more specifically to a novel memory and addressing scheme.

BACKGROUND OF THE INVENTION

At the present time memories are utilized in virtually every type of electrical and electronic device to store data, e.g. information, operating instructions, etc. These memories are manufactured in a large variety of types including random access memories (RAM), read only memories (ROM), erasable/programmable memories (EPROM), electronically erasable/programmable memories (EEPROM), to name a few. Also, these various memories are manufactured using a variety of techniques and physical concepts, e.g. magnetic memories, capacitive memories, etc., which are in turn divided into active arrays and passive arrays. Further, at least some of the memories are small enough to allow up to mega-bytes of information to be stored in a single memory module of practical size.

However, one major problem that is prevalent in all of the prior art memories is the fact that each bit of memory must be addressed individually by means of critically positioned conductors to read (and/or write) information from (or to) the bit. Most conventional memories are intrinsically two dimensional. The usual addressing technique for 2-D memories requires the selection of a row and column port of the array which are common to the selected bit. These rows and columns provide access to localized memory elements that are uniformly distributed in one plane. This results in hundreds of critically positioned conductors (rows, columns and I/O terminals or ports) in conjunction with the large arrays of memory bits making up a large memory. In many instances the I/O ports actually require more chip real estate or area than the array of memory bits. Because present day manufacturing techniques are limited to some type of lithography in the fabrication of the memory arrays and because the line size of the lithography is limited to submicron (generally 0.25 micron), the size of present day memories is quickly reaching an upper limit. This is primarily due to escalating fabrications costs as well as undesired quantum effects. (For example, Professor W. Maly at Carnegie Mellon showed that extrapolations of cost projections in the SIA's 1997 National Technology Roadmap for Semiconductors result in single-die costs as high as $1800 for DRAMS.) Further, as lithography line sizes are reduced and memories are made larger, the cost of manufacturing the memories is increasing at a very substantial rate.

Yet, the motivation for continued miniaturization is such that all major corporations are conducting research to find nanometer-sized implementations for the logic and memory functions. In the published research literature on such nanometer-sized functions, three major problems remain: unacceptably high error rates at room temperatures; lack of cost effective mass production; and no effective I/O interface with ordinary CMOS logic.

Thus, it would be very beneficial to provide a memory which does not require (expensive) precision fine detail lithography in order to isolate and access each individual bit in the memory for read and/or write operations.

It is a purpose of the present invention to provide a new and improved memory and logic.

It is another purpose of the present invention to provide a new and improved memory that is relatively simple and inexpensive to manufacture.

It is still another purpose of the present invention to provide a new and improved memory that has virtually no upper limits on the size, or number of bytes it can store.

It is yet another purpose of the present invention to provide a new and improved memory that is highly manufacturable and does not require fine detail lithography to produce the memory elements.

It is a further purpose of the present invention to provide a new and improved memory that is much smaller than prior art memories.

SUMMARY OF THE INVENTION

The above problems and others are substantially solved and the above purposes and others are realized in quantum random address memory apparatus including a low dimensional plurality of address ports, a plurality of nano-memory elements, mixer elements coupling the address ports to a high dimensional plurality of the plurality of nano-memory elements, and data output ports and structure coupled to the plurality of nano-memory elements. The high dimensional plurality of nano-memory elements is greater than the low dimensional plurality of address ports by a number resulting in substantially error free memory recalls.

BRIEF DESCRIPTION OF THE DRAWINGS

Referring to the drawings:

FIG. 1.is a simplified block diagram of a prior art flash memory;

FIG. 2. is a simplified block diagram illustrating various components and their operation in a memory in accordance with the present invention;

FIG. 10 is a greatly simplified schematic view of the quantum random address memory apparatus illustrated in FIG. 9.

DESCRIPTION OF THE PREFERRED EMBODIMENTS

Figure 3:
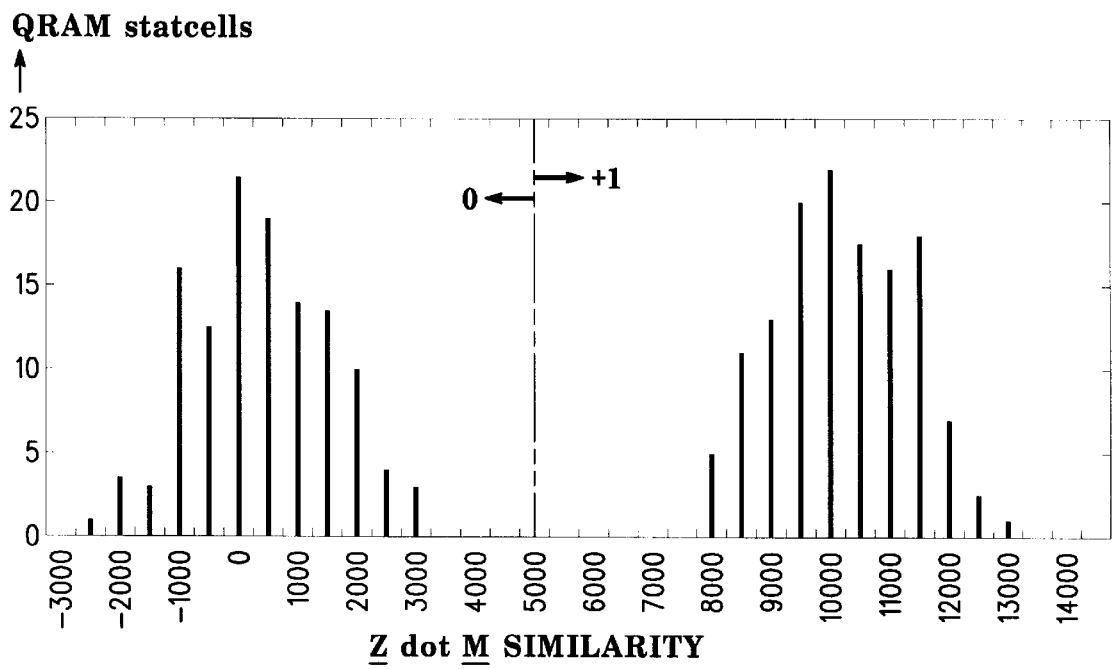
FIG. 3 is a histogram of recall data in the apparatus of FIG. 2.

Turning now to the drawings and specifically to FIG. 1, a prior art 256×1 flash memory is illustrated in simplified block form. The operation of the flash memory will be understood by those skilled in the art and, therefore, will not be explained in detail herein. The conventional flash memory uses spatially independent bit cells by splitting the 256 addresses into 16 rows and 16 columns, as shown in FIG. 1. One cell, capable of storing one bit, is positioned at each row-column intersection so that each cell has a unique row-column intersection at which it can be addressed without effecting any of the other cells. It should be noted however, that the prior art flash memory is a two dimensional device only and utilizing any of the well known present practices requires the use of lithography for the fabrication of every bit. Further, the best that can be produced at the present time results in a chip area size of approximately 2000 square microns.

Turning now to FIG. 2, a simplified block diagram/flow chart is provided illustrating various components and their operation in 256×1 quantum random address memory apparatus 10 in accordance with the present invention. The simplified block diagram/flow chart of FIG. 2 is provided only for use in describing the operation and theory of the apparatus 10 and is not intended to describe a complete working structure. Apparatus 10 of FIG. 2 includes eight address ports, $A_0$ through $A_7$, that are illustrated as A and are coupled through eight buffer amplifiers to pseudo-random nonlinear mixer elements 25. Because of the number of mixer elements 25 and the connections to the eight address ports, as illustrated in FIG. 2, eight address bits into the system results in 10,000 bits (channels, lines or bits) out. The mixer elements 25 are coupled to memory elements 20 which are in turn coupled to readout mechanism 21. While more memory elements may be included, it is assumed that at least 10,000 memory elements 20 are coupled to 10,000 mixer elements 25. Here it should be noted that 10,000 memory elements are utilized because that number yields a substantial noise margin, as will be explained presently, as well as a small area of about 4 square microns for a 256×1 bit memory. Thus, apparatus 10 has a total area approximately 500 times smaller than the area of the prior art flash memory illustrated in FIG. 1.

To understand the operating principle of apparatus 10, it should be understood that statistically independent bit cells (statcells) are used. First, vector M, which comprises charges on 10,000 nano-memory elements 20, such as polymer molecules, quantum dots, etc., is cleared or randomized. This clears all 256 statcells to the logical '0' state. Now only the statcells that are selected to be logical '1' need to be written. All 256 bits are stored, in a distributed fashion, in the memory vector M. Each nano-memory element in M stores only a small fraction of each of the 256 bits. That is, each whole bit is distributed among all of the 10,000 nano-memory elements of M. This distributed code provides excellent noise and fault tolerance For each address A, there is a different pseudo-random vector $Z_A$ of dimension 10,000. The 10,000 nano-memory elements in each $Z_A$ vector are each +1 or −1. (Note, other functionally equivalent systems can be used, too. For example, '1' and '0' with positive summation and negative summation nodes.) The independence of the 256 statcells is achieved based upon simple probabilities. For example, writing a '1' bit into the statcell corresponding to address A=35 does not change the data bit in the statcell corresponding to address A=36 because it is almost certain that $Z_{35}$ has nearly zero correlation with $Z_{36}$. Here it should be understood that the highly accurately positioned memory elements of conventional memories are one extreme of the spectrum while totally random memory elements are the other extreme. There is a lot of middle ground between these extremes which can be achieved by biasing the statistics in favor of even more uncorrelated Z vectors. This middle ground is encompassed in the present disclosure in the term "pseudo-random" which is intended to cover everything from totally random to somewhat randomly positioned, as long as the placement does not require fine detail lithography.

To read out the data bit stored in statcell 35, simply measure the degree of similarity between the two patterns M and $Z_{35}$. One way to do this is to threshold the scalar product of $Z_{35}$ and M. For example, if $Z_{35}$ is added to M, then this new M' will be more similar to $Z_{35}$ (i.e. data bit=1) than if the addition had not been done (i.e. data bit =0). Note that the vector or pattern $ZZ_{35}$ is used as a reference, somewhat like a reference beam in holography or a channel code in CDMA telephony.

To write a '1' data bit to statcell 35, simply add $Z_{35}$ to M. Likewise, to write a '1' data bit to statcell 36, simply add $Z_{36}$ to M. Note that $Z_{35}$ and $Z_{36}$ are added to the same M. The nearly zero correlation keeps the data bits in statcells 35 and 36 separate and independent.

In essence, statcell independence occurs because adding $Z_{35}$ to M adds +1 to a specific subset$_1$ of the elements in M and subtracts 1 from the remaining specific subset$_2$ of the elements in M. Now, adding $Z_{36}$ to the same M adds as much as it subtracts from the subset$_1$. Likewise, for subset$_2$. The net effect is zero. When the data bit in statcell 35 is read back or recalled (i.e. M is probed with $Z_{35}$), the pattern similarity measure is essentially unchanged. Thus, writing to statcell 36 does not disturb the data in statcell 35. Note that this independence requires pseudo-random vectors of high dimension (10,000 in this example) for excellent error tolerance.

Figure 4:
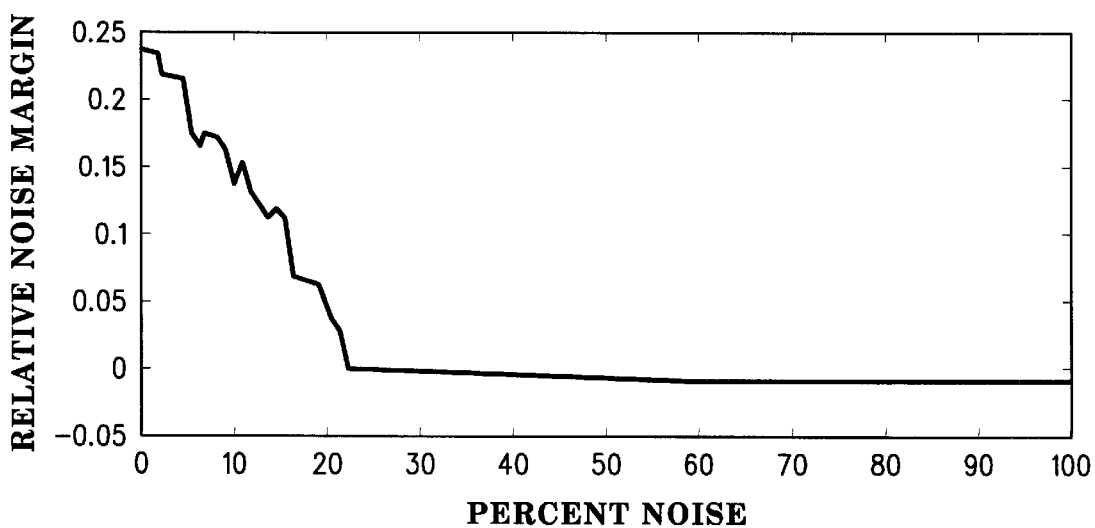
FIG. 4 is a graphical representation of the tolerance to defects and noise of the apparatus of FIG. 2.

Turning to FIG. 3, a histogram of recall, or read back, data for apparatus 10 of FIG. 2 is illustrated. The horizontal axis indicates the degree of similarity between Z and M. The similarity value for each statcell reveals the data bit value (0 or 1) that was most recently stored in that statcell. The vertical axis indicates the total number of statcells within a specific bin (i.e. within a specific range of similarity values. The total number of statcells is 256, considering all bins). The 'minimum noise margin' (distance along the similarity axis between zero and the worst or least decisive memory statcell's similarity value) is about 2000 which is a large fraction of the distance (5000) from the threshold value (5000) to either distribution peak. This large margin provides considerable noise tolerance. As shown in FIG. 4, up to 20%'noise' can be tolerated in apparatus 10 without any bit errors. For example, 'percent noise' can be the percent of the 10,000 nano-memory elements 20 that are totally defective (e.g. they can not tunnel charge). Alternatively,'percent noise' can be the percent of the 10,000 nano-memory elements in $Z_A$ that are totally ineffective (e.g. they can not convey changes in voltage).'Relative noise margin' is 'minimum noise margin', as previously defined, divided by the dimensionality, which is 10,000 in this example. Thus, as illustrated in FIG. 4, up to 20% of the Z or M nano-memory elements can be defective without any bit errors.

Figure 5:
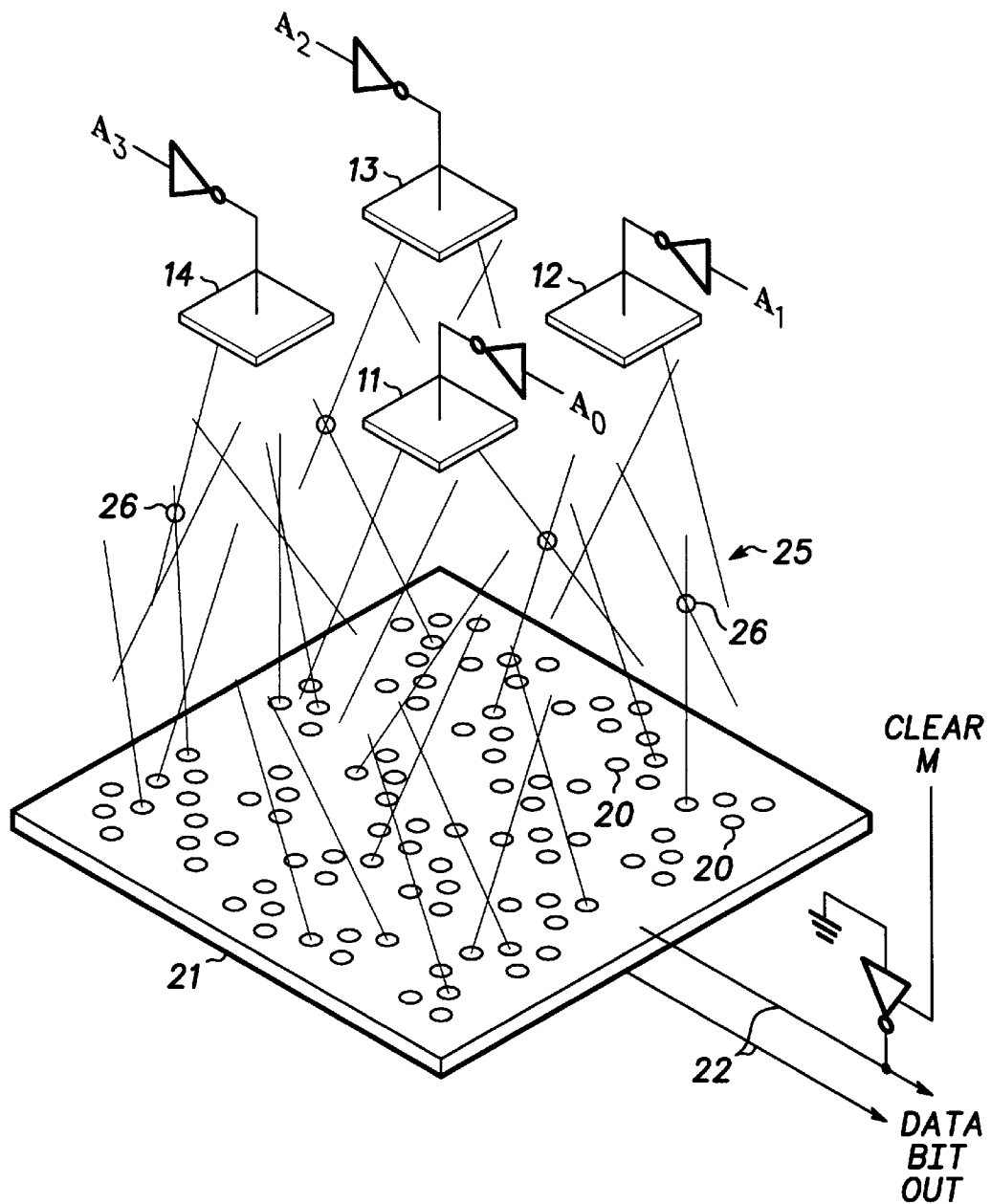
FIG. 5 is a simplified isometric view of quantum random address memory apparatus in accordance with the present invention.

Referring to FIG. 5, a simplified isometric view is illustrated of quantum random address memory apparatus 10 in accordance with the present invention. Because FIG. 5 illustrates a specific embodiment (greatly simplified) of the apparatus illustrated in simplified block form in FIG. 2, similar components will be designated with similar numbers. Apparatus 10 of FIG. 1 is illustrated in a very simplified mode for purposes of this explanation and it should be understood by those skilled in the art that this figure is not intended to limit the scope of the invention in any way. Apparatus 10 includes eight address ports, $A_0$ through $A_7$ (only four of which are illustrated), that are illustrated as square metal pads 11 through 13 which are each coupled to an externally available terminal through a CMOS buffer (for example only). As will be understood by those skilled in the art, eight address ports results in 256 possible input addresses, assuming a binary system.

Apparatus 10 further includes a plurality of nano-memory elements 20 supported on readout mechanism, which in this embodiment is a piezoelectric layer 21. Nano-memory elements 20 can be any of a large variety of devices including quantum dots, magnetic tunneling junctions, resistors etc., and in this example are quantum dots pseudo-randomly placed on piezoelectric layer 21. The pseudorandom fabrication and placement of quantum dots is a relatively straight forward process involving the deposition of material and not requiring any lithography, resist patterns, or the like. An example of one fabrication process for quantum dots is described in U.S. Pat. No. 5,614,435, entitled "Quantum Dot Fabrication Using Strained Epitaxial Growth", issued Mar. 25, 1997. Each quantum dot 20 is three dimensionally limited so that it operates similar to a quantum well and will trap one or more carriers (electrons or holes depending upon the construction) which in turn operate as a stored charge.

Mixer elements 25 are incorporated to couple address ports, $A_0$ through $A_7$, to a high dimensional plurality of nano-memory elements 20. Mixer elements 25 are pseudo-randomly positioned, non-linear electrically conductive elements, such as nano-diodes, self-assembled conductive polymer chains, or the like. Generally, mixer elements 25 are fabricated by any convenient process that does not require lithography and which results in essentially uncorrelated patterns of energy (e.g. charge) at the 10,000 terminals for every pair of addresses A. Here it should be understood that each of the nano-memory elements 20 are not necessarily connected to one or more of the address ports, $A_0$ through $A_7$. It is only required that a high dimensional plurality of nano-memory elements 20 are connected to a low dimensional plurality of address ports, $A_0$ through $A_7$. Further, the high and low dimensional pluralities are defined such that the high dimensional plurality of nano-memory elements 20 is greater than the low dimensional plurality of address ports, $A_0$ through $A_7$, by a number resulting in substantially error free memory recalls. Through mathematical analysis and extensive testing it has been determined that this number is at least 40, although a smaller number may be utilized in specific applications requiring less accuracy or more tolerance of errors, or if more control/precision is exerted during manufacture (thereby replacing our word 'pseudo-random' with the phrase 'substantially linearly independent'). For example, some applications may include self correcting circuits in which more errors in memory recall can be tolerated. In the above example, with 256 possible addresses, the number of connections between nano-memory elements 20 and mixer elements 25 should be at least 40×256 or approximately 10,000. By using at least 40 times as many connections between nano-memory elements 20 and address ports, $A_0$ through $A_7$, as the number of potential addresses in apparatus 10, up to 20% errors can occur in the connections without an output bit error occurring in the data recall, as explained above.

In the specific embodiment illustrated in FIG. 5, the readout mechanism includes piezo layer 21 which has output ports 22 attached thereto for providing a data bit output for each address applied to address ports, $A_0$ through $A_7$. In the embodiment using piezo layer 21 as the readout mechanism, the data bit output is in the form of a voltage pulse at output ports 22 produced by the interaction of the addressed nano-memory elements 20 with the piezo layer 21. For additional information on the operation and construction of piezo layer readout mechanisms see the copending application entitled "Quantum Random Address Memory with Piezo Layer Readout" filed of even date herewith, bearing attorney docket number CR98-091, and assigned to the same assignee.

Figure 6:
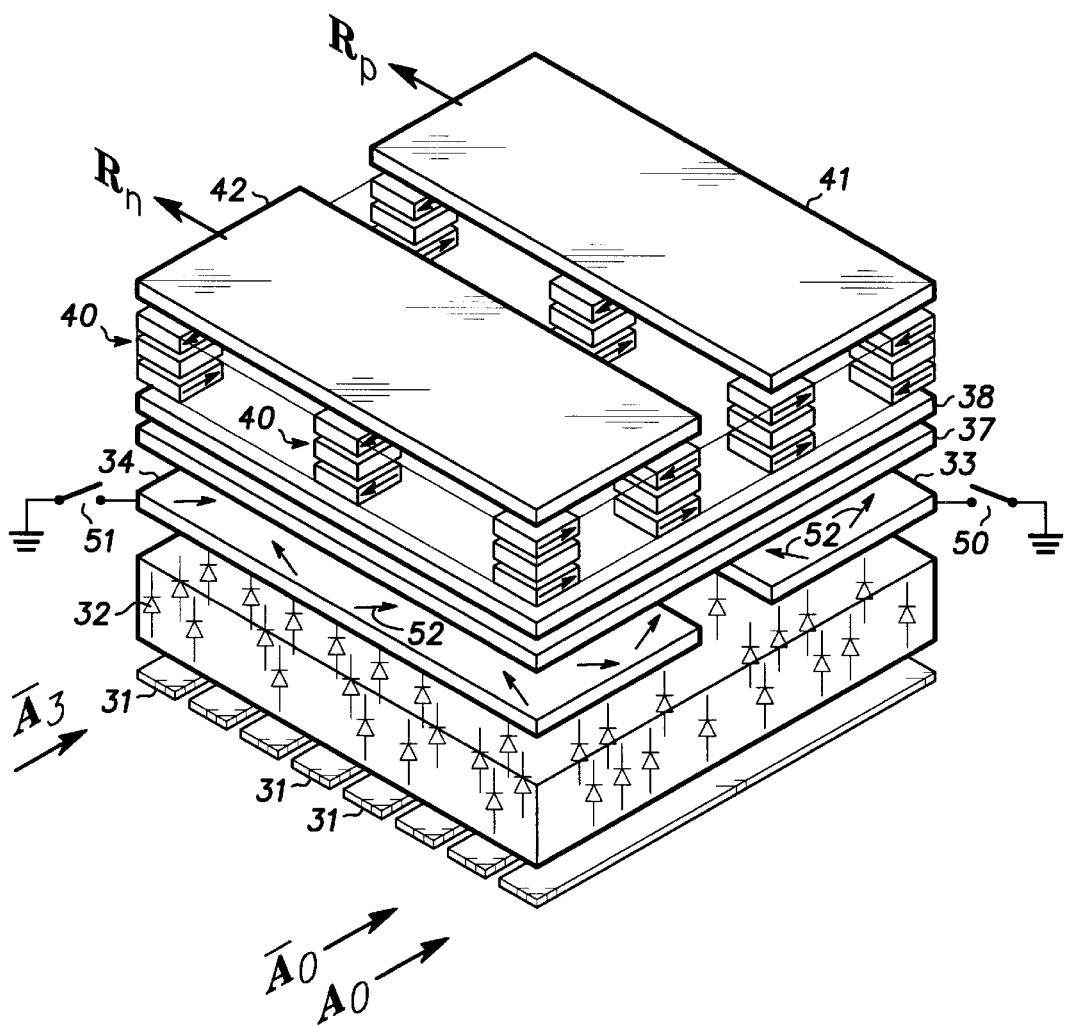
FIG. 6 is a simplified isometric, partial schematic, view of another embodiment of quantum random address memory apparatus in accordance with the present invention.

Turning now to FIG. 6, a simplified isometric, partial schematic, view is illustrated of another embodiment of quantum random address memory apparatus 30 in accordance with the present invention. Apparatus 30 includes eight address ports, designated $A_0$ through $A_3$, and the invert of each. In this embodiment the address ports are represented by eight parallel spaced apart conductive strips 31, one strip for each of the address ports. A plurality of mixer elements, which in this embodiment are pseudo-randomly placed nano-diodes 32, each have one terminal (in this embodiment the anode) coupled to the address ports 31 Explicit details on the fabrication of pseudo-randomly placed nano-diodes can be found in a copending U.S. Patent Application entitled "Quantum Random Address Memory with Randomly Positioned Nano-diode Mixer", filed of even date herewith, bearing attorney docket number CR98-090, and assigned to the same assignee.

A pair of spaced apart electrical conductors 33 and 34 are positioned over nano-diodes 32 so as to extend transverse to the parallel spaced apart strips 31 with each electrical conductor 33 and 34 coupled (to the cathodes) to a different approximately one half of the plurality of nanodiodes 32. An electrical insulating layer 37 is positioned over conductors 33 and 34 and an electrically conducting layer 38 is positioned over insulating layer 37. A plurality of nano-memory elements, which in this embodiment are pseudo-randomly placed magnetic tunneling nano-junctions 40, are positioned on layer 38. A pair of spaced apart electrical conductors 41 and 42 are positioned over magnetic tunneling nano-junctions 40 so as to extend transverse to the parallel spaced apart strips 31 (generally overlying conductors 33 and 34) with each electrical conductor 41 and 42 coupled to a different approximately one half of the plurality of nano-junctions 40. Conductors 41 and 42 are connected to provide signals Rp and Rn, respectively, which when combined ($R_p$—$R_n$) produce a data bit output. Generally, conductors 33 and 41 define a 'p' section of apparatus 10 and conductors 34 and 42 define a 'n' section. It should be noted that none of the structure illustrated in FIG. 6 requires lithography, except possibly strips 31 and electrical conductors 33, 34 and 41, 42.

Each magnetic tunneling nano-junction 40 includes a pair of magnetic layers separated by a very thin non-magnetic non-conducting layer which serves as a barrier. Also, each magnetic tunneling nano-junction 40 is sandwiched between layer 38 and either conductor 41 or 42 so that one magnetic layer is positioned on layer 38 and the other magnetic layer is positioned on one of conductors 41 or 42. With an appropriate voltage applied carriers will tunnel from one of the magnetic layers to the other magnetic layer through the barrier layer. Each magnetic tunneling nano-junction 40 appears electrically as a resistance with the amount of resistance being determined by the position of magnetic vectors in each of the two magnetic layers. If the magnetic vectors in a nano-junction are pointed in the same direction (parallel) the resistance is a minimum and if the vectors are pointed in opposite directions (antiparallel) the resistance is a maximum. Thus, by setting the magnetic vectors in each nano-junction 40 a '1' or a '0' (represented by a low or a high resistance) can be stored. For additional information on the operation and construction of magnetic tunneling nano-junctions 40, see the copending application entitled "Quantum Random Address Memory with Magnetic Tunneling Nano-Junctions", filed of even date herewith, bearing attorney docket number CR98-092, and assigned to the same assignee. grounded through a switch 50 to write a '1' into the 'p' section and conductor 34 can be grounded through a switch 51 to write a '0' into the 'n' section. When switch 50 is closed, for example, conductor 33 is grounded, Each nano-diode 32 connected to conductor 33 produces a current in conductor 33 (represented by arrows 52) in accordance with the signals applied to strips 31, which creates a field that modifies the magnetic vector in the closest magnetic tunneling nano-junction 40. To read the stored information, a signal is applied to conductive layer 38 and read at conductors 41 and 42 as $R_pR_n$. Again it must be understood that the nano-diodes 32 and the number of magnetic tunneling nano-junctions 40 are great enough to insure that a write signal applied to each strip 31 effects a substantially different group of pairs of nano-diodes 32 and magnetic tunneling nano-junctions 40.

Figure 7:
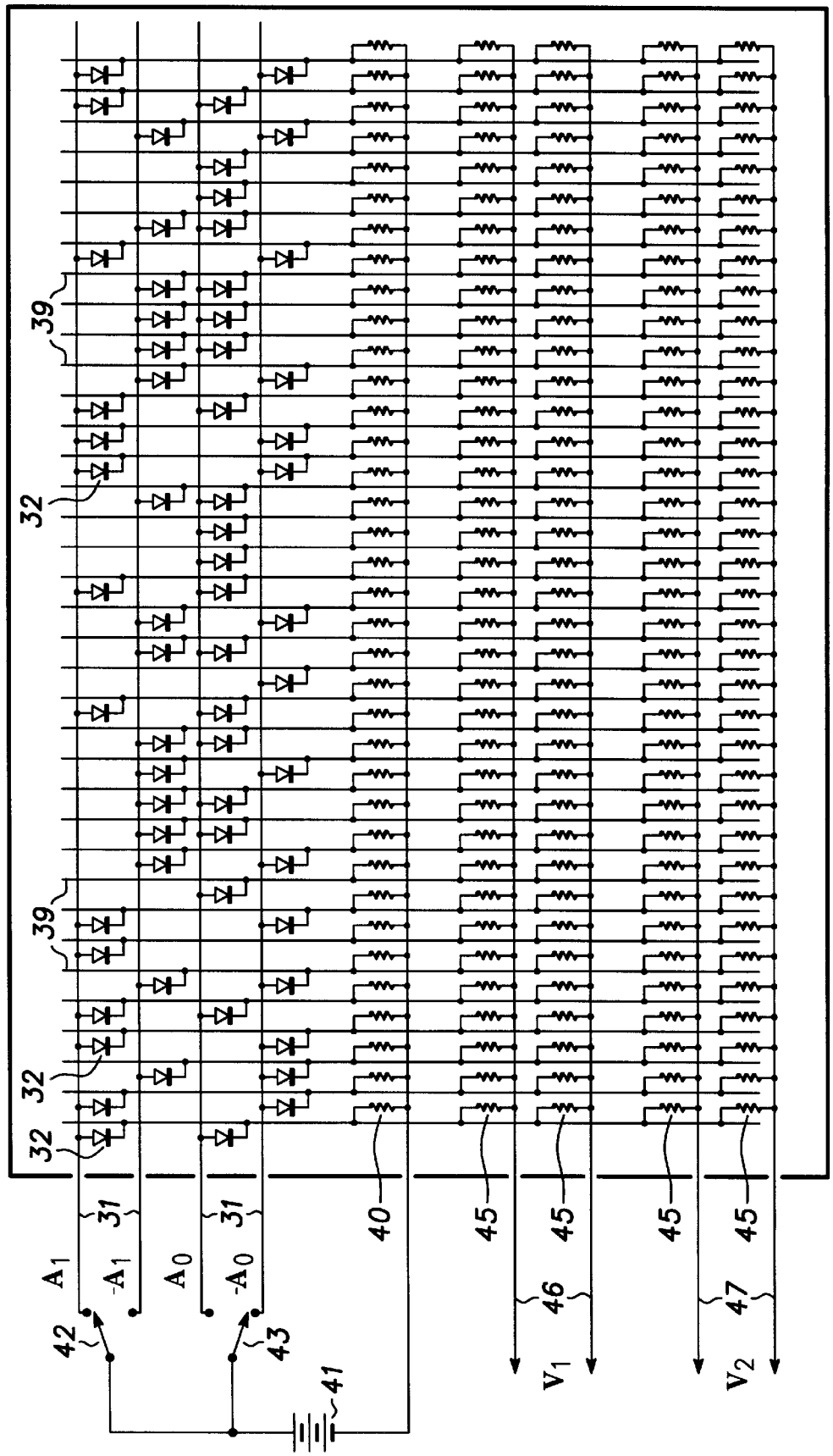
FIG. 7 is a greatly simplified schematic view of the quantum random address memory apparatus illustrated in FIG. 6.

Turning now to FIG. 7, a greatly simplified schematic view is illustrated of the quantum random address memory apparatus 30 illustrated in FIG. 6. The schematic diagram of FIG. 7 is intended to aid in the understanding of apparatus 30 of FIG. 5 and is not intended as a rigorous representation of that apparatus. For simplicity, only four conductive strips 31, designated individually as $A_0$, $-A_0$, $A_1$, and $-A_1$, for convenience, are illustrated for address ports. (It should be understood that the minus sign, e.g. $A_0$ indicates a negative, reciprocal, or compliment of the mating signal, i.e. $A_0$) Also, a plurality of nano-diodes 32, representing mixer elements, each have the anode connected to one of the strips 31 for simplicity in explaining the addressing, as will be understood presently. Further to accentuate the different connections of the mixer elements different nano-diodes are connected to each strip 31. The mixer, including nano-diodes 32, has outputs (for example, the 10,000 terminals described in conjunction with FIG. 5) represented in FIG. 7 by a plurality of mixer leads 39. Each mixer lead 39 is connected through an associated resistor 40 to the negative side of a power supply 41. The positive side of power supply 41 is connected to the arms of a pair of two position switches 42 and 43, which represent the application of an address (1 or 0) to strips 31. A plurality of nano-memory elements 45 are illustrated schematically as resistors each having one end connected to one of the plurality of mixer leads 39. In this simplified schematic view a first data output port $V_1$ is represented by a pair of output leads 46 and a second data output port $V_2$ is represented by a pair of output leads 47. The opposite end of each of the nano-memory elements (resistors 45) is connected to one of the pair of output leads 46 or one of the pair of output leads 47, i.e. $A_0$, $-A_0$, Al, or $-A_1$.

In this embodiment, to simply illustrate the operation, the pair of switches 42 and 43 are connected to complete a circuit between a selected pair of strips 31 and power supply 41. Switch 42 applies a positive voltage to $A_1$ in a first position and to $-A_1$ in a second position. Switch 43 applies a positive voltage to $A_0$ in a first position and to $-A_0$ in a second position. In each instance the positive voltage is applied to the anode of a different set of nano-diodes 32 and represents a 1 or a 0. The negative side of power supply 41 is connected to each mixer lead 39 through associated resistor 40 to complete the circuit for purposes of this representation.

Figure 8:
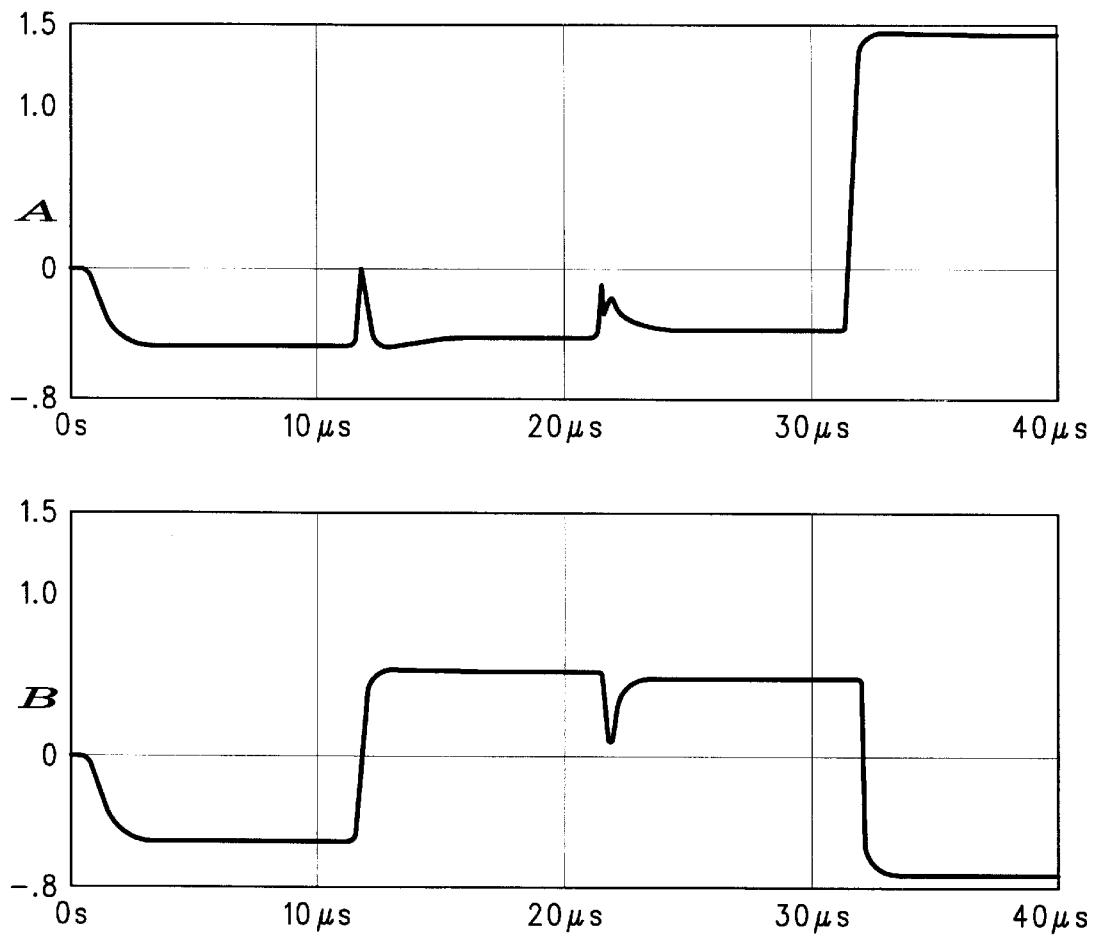
FIG. 8 illustrates voltage waveforms produced at various points in the apparatus of FIG. 7.

Referring to the waveforms of FIG. 8 in conjunction with apparatus 30 in FIG. 7: waveform A illustrates the voltage $V_1$ present between the pair of output leads 46 and waveform B illustrates the voltage $V_2$ present between the pair of output leads 47. The voltages illustrated were obtained with power supply 41 represented by a 3 volt battery and each of the associated resistors 40 represented by a 100k ohm resistor.

Figure 9:
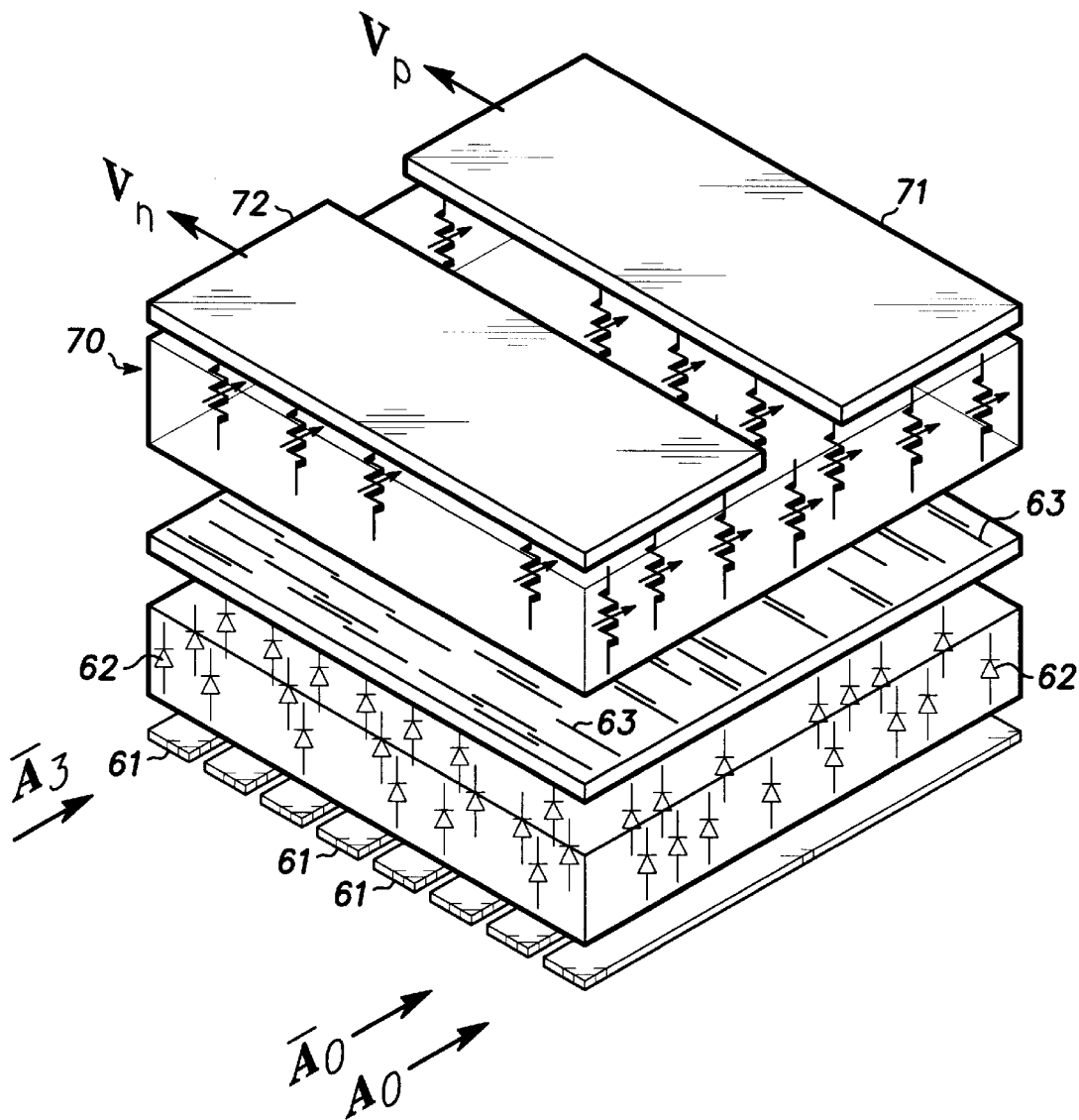
FIG. 9 is a simplified isometric, partial schematic, view of another,embodiment of quantum random address memory apparatus in accordance with the present invention.

Referring specifically to FIG. 9, a simplified isometric, partial schematic, view is illustrated of an embodiment of quantum random address memory apparatus 60 in accordance with the present invention. Apparatus 60 includes eight address ports, designated $A_0$ through $A_3$, and the invert or reciprocal of each ($-A_0$ through $-A_3$). In this embodiment the address ports are represented by eight parallel spaced apart conductive strips 61, one strip for each of the address ports. A plurality (generally thousands) of mixer elements, which in this embodiment are pseudo-randomly placed nano-diodes 62 positioned in a layer of dielectric material, each have one terminal (in this embodiment the anode) coupled to the address ports 61. Explicit details on the fabrication of pseudo-randomly placed nano-diodes can be found in a copending U.S. Patent Application entitled "Quantum Random Address Memory with Randomly Positioned Nano-diode Mixer", filed of even date herewith, bearing attorney docket number CR98-090, and assigned to the same assignee.

A plurality (generally thousands) of pseudo-randomly positioned, but generally parallel oriented electrical conductors 63 (formed in a thin dielectric layer for convenience) are positioned over nano-diodes 62 so as to extend transverse to the parallel spaced apart strips 61 with individual conductors pseudo-randomly coupled (to the cathodes) to different nano-diodes or groups of nano-diodes 62. Electrical conductors 63 can be formed and positioned in a variety of different techniques including, for example, conductive polymers or thin metal strands that are suspended in a solution and oriented by a magnetic or electric force during drying of the solution to form a solid layer.

A plurality (generally thousands) of nano-memory elements, which in this embodiment are illustrated as pseudo-randomly placed adaptive resistors 70, are positioned in a dielectric layer of material and on the layer containing electrical conductors 63 so as to be pseudo-randomly coupled by different electrical conductors 63 or groups of electrical conductors 63. Thus, electrical conductors 63 generally pseudo-randomly couple one or more nano-diodes 62 to one or more adaptive resistors 70. Adaptive resistors 70 can be fabricated, for example, by methods described in a U.S. Patent entitled "Circuit Utilizing Resistors Trimmed by Metal Migration", issued Feb. 16, 1988. While adaptive resistors 70 are illustrated herein as nano-memory elements, it should be understood that other elements can be used, including magnetic tunneling nano-junctions, quantum dots, etc.

A pair of spaced apart electrical conductors 71 and 72 are positioned over nano-memory elements 70 so as to extend parallel with electrical conductors 63 (i.e. arranged so as to thoroughly mix the influences from combinations of address A bits) and transverse to the parallel spaced apart strips 61, with each electrical conductor 71 and 72 coupled to a different approximately one half of the plurality of nano-memory elements 70 (i.e. arranged so as to provide two intrinsically balanced halves of a different output). Conductors 71 and 72 are connected to provide signals $V_p$ and $V_n$, respectively, which when combined ($V_p$—$V_n$) produce a data bit output. Generally, conductor 71 defines a 'p' section of apparatus 60 and conductor 72 defines a 'n' section. It should be noted that none of the structure illustrated in FIG. 9 requires lithography, except possibly strips 61 and electrical conductors 71 and 72.

Turning now to FIG. 10, a greatly simplified schematic view is illustrated of the quantum random address memory apparatus illustrated in FIG. 9. The schematic diagram of FIG. 10 is intended to aid in the understanding of apparatus 60 of FIG. 9 and is not intended as a rigorous representation of that apparatus. A plurality of nano-diodes 62 each have the anode connected to one of the strips 61 and the cathode connected to one of electrical conductors 63 to represent mixer elements. A plurality of adaptive nano-resistors 70 each have one end connected to either conductor 71 or conductor 72 and a second end connected to one of electrical conductors 63. For convenience of this explanation, electrical conductors 63 are illustrated as single lines extending the length of the apparatus, but it should be understood that these lines and the connections illustrated are generally pseudo-random. Also, for convenience of this description, each electrical conductor 63 is illustrated as being connected through an adaptive nano-resistor 70 to each conductor 71 and 72. It should be understood, however, that these connections are generally pseudo-random and all of the connections that this implies are possible, from zero connections to nano-diodes 62 and/or adaptive nano-resistors 70 for some electrical conductors 63 to a plurality of nano-diodes 62 and/or adaptive nano-resistors 70 for some electrical conductors 63.

In this embodiment, to simply illustrate the operation, each strip 61 is connected by the source-drain of one of eight FETs 75 to a voltage supply $V_{dd}$. To activate selected ones of FETs 75, one input, $A_0$ through $A_3$, and their complements, are applied to each gate of FETs 75. To write a logic '0' into the memory in any selected one of the 16 addresses, the selected address is activated and conductor 71 is connected through the source-drain of a FET 76 to a voltage source $V_{ss}$ and a pulse is applied to the gate of FET 76 in order to turn it on for the pulse width. To write a logic '1' into the memory in any selected one of the 16 addresses, the selected address is activated and conductor 72 is connected through the source-drain of a FET 77 to the voltage source $V_{ss}$ and a pulse is applied to the gate of FET 77 in order to turn it on for the pulse width. Thus, when writing a logic'0', current flows from $V_{dd}$ generally through multiple selected FETs 75, the specific strip 61 connected to the selected FET 75, through all circuits completed to conductor 71 by connections of nano-diodes 62, electrical conductors 63 and adaptive nano-resistors 70, and through FET 76 to Vss. Similarly, when writing a logic'1', current flows from Vdd generally through multiple selected FETs 75, the specific strip 61 connected to the selected FETs 75, through all circuits completed to conductor 72 by connections of nano-diodes 62, electrical conductors 63 and adaptive nano-resistors 70, and through FET 77 to $V_{ss}$. The flow of current produced by the write circuit adjusts the adaptive nano-resistors 70 (in one implementation reducing the resistance) so that the current paths formed are predominant during read operations over any other possible current paths.

A read circuit includes a pair of FETs 80, each connecting one of the conductors 71 and 72 through a source-drain to voltage supply $V_{ss}$. and both activated by a positive 'read' pulse on the gates. The read circuit further includes a differential amplifier comparator circuit, generally designated 82, having conductors 71 and 72 connected as opposed inputs and a single bit output 83.

In this specific embodiment, apparatus 60 of FIG. 10 is connected to operate as a one-time-field-programmable-ROM. Further, because addresses $A_0$ through $A_3$, and their complements are illustrated, 16 memory locations are possible. Here it should be understood that this small memory capacity is used only to simplify the illustration and the accompanying explanation. Data output port 83 is one bit wide, thus, providing a memory 16×1. Multiple bit width ports are possible by simple extensions of the present description.

A broken line 85 around all but the contact ends of strips 61, nano-diodes 62, electrical conductors 63, and adaptive nano-resistors 70, indicates that all components therein are self-organized nanometer sized elements. It should be specifically noted that no transistors or other patterned devices are needed within broken line 85. Ordinary 0.5 micrometer CMOS techniques can be used to fabricate all of the transistors and circuitry outside of broken line 85. Also, an ordinary 0.5 micrometer CMOS external circuit (not shown) can interface with apparatus 60 by driving the address lines ($A_0$ through $A_3$, and their complements) and write control lines and by reading the logic level on data output port 83. The external circuit applies an address A, which causes (most of) many small currents to flow into a specific subset of adaptive memory elements $M_n$ and $M_p$ and finally to $V_{ss}$. Although this specific subset is initially determined by pseudo-random placement of junctions and adaptive elements, it is uniquely associated with just one address $A_i$, due to statistics of large pseudo-random numbers. Furthermore, writing data to one address does not lead to a data bit error at another address, again due to the statistics of large pseudo-random (uncorrelated) numbers.

The thousands of adaptive nano-resistors 70 change resistance values when data is written to apparatus 60 (coincident with the application of a specific address $A_i$. Adaptive nano-resistors 70 are somewhat like artificial neural network synapses, in that they obey a Hebbian learning rule (i.e. they further lower their resistance when current flowing there through exceeds a fixed threshold). To write data to apparatus 60, currents are allowed to exceed the fixed threshold, thereby allowing adaptive nano-resistors 70 to change resistance values. The external circuit applies and address $A_i$, which cause (most of) many small currents to flow into a specific subset, $M_n$ and $M_p$, of adaptive nano-resistors 70 and finally to $V_{ss}$ via either write transistor 76 or 77. In this specific embodiment, if a logic '1' is written, then more current flows in the $M_p$ set (conductor 72) of adaptive nano-resistors 70, causing them to lower their resistance values.

To read data from apparatus 60, currents are limited to values well below the fixed threshold, thereby not allowing adaptive nano-resistors 70 to change resistance values. The external circuit applies an address $A_i$, which causes (most of) many small currents to flow into a specific subset, $M_n$ and $M_p$, of adaptive nano-resistors 70 (memory elements) and finally to $V_{ss}$. The current difference between the $M_n$ and $M_p$ adaptive nano-resistor 70 sets is amplified to saturation by comparator circuit 82 yielding the data bit output signal. If more current flows in the $M_n$ set, then the data bit is read as a logic '1'. otherwise it is a logic '0'.

Thus, a new and improved memory which does not require the individual addressing via critically placed conductors of each bit in the memory for read and/or write operations is disclosed. The new and improved memory is relatively simple and inexpensive to manufacture and has virtually no upper limits on the size, or number of bytes it can store. Also, the new and improved memory is highly manufacturable and does not require lithography to produce the memory elements but is still much smaller than prior art memories.

While I have shown and described specific embodiments of the present invention, further modifications and improvements will occur to those skilled in the art. I desire it to be understood, therefore, that this invention is not limited to the particular forms shown and I intend in the appended claims to cover all modifications that do not depart from the spirit and scope of this invention.

What is claimed is:

1. A quantum random address memory with nano-diode mixer comprising:

a plurality of address ports providing a low dimensional plurality of addresses;

data output structure;

a plurality of nano-memory elements;

a plurality of pseudo-randomly positioned, non-linear mixer elements coupling one of the plurality of address ports and the data output structure to a high dimensional plurality of the plurality of nano-memory elements; and the other of the plurality of address ports and the data output structure being coupled to the plurality of nano-memory elements, wherein the high dimensional plurality of nano-memory elements is greater than the low dimensional plurality of addresses.

2. Quantum random address memory apparatus as claimed in claim 1 wherein the high dimensional plurality of nano-memory elements is greater than the low dimensional plurality of addresses by at least a factor of 40.

3. Quantum random address memory apparatus as claimed in claim 1 wherein the plurality of nano-memory elements are pseudo-randomly placed on a support structure.

4. Quantum random address memory apparatus as claimed in claim 3 wherein the nano-memory elements each include one of quantum dots, magnetic tunneling junctions, and resistors.

5. Quantum random address memory apparatus as claimed in claim 1 wherein the mixer elements are pseudo-randomly positioned, non-linear elements.

6. Quantum random address memory apparatus as claimed in claim 5 wherein the mixer elements each include one of pseudo-randomly placed nano-diodes and self-assembled conductive polymer chains.

7. Quantum random address memory apparatus as claimed in claim 1 wherein the plurality of address ports include parallel spaced apart conductive strips, one strip for each of the address ports and the data output structure includes a pair of spaced apart electrical conductors extending transverse to the parallel spaced apart strips with each electrical conductor coupled to a different approximately one half of the plurality of nano-memory elements.

8. Quantum random address memory apparatus as claimed in claim 7 wherein the data output structure includes circuitry coupled to the pair of spaced apart electrical conductors for comparing the electrical signals at each of the pair of spaced apart electrical conductors.

9. Quantum random address memory apparatus as claimed in claim 8 wherein the circuitry for comparing the electrical signals includes a differential amplifier.

10. Quantum random address memory apparatus as claimed in claim 1 wherein the data output structure includes a piezo layer with the plurality of nano-memory elements positioned thereon.

11. Quantum random address memory apparatus as claimed in claim 1 wherein the plurality of pseudo-randomly positioned, non-linear mixer elements include a plurality of pseudo-random electrical conductors and a plurality of pseudo-random nano-diodes positioned to pseudo-randomly couple the plurality of address ports to the plurality of nano-memory elements.

12. Quantum random address memory apparatus as claimed in claim 11 wherein the plurality of nano-memory elements include adaptive nano-resistors.

13. Quantum random address memory apparatus as claimed in claim 11 wherein the plurality of electrical conductors includes self-assembled conductive polymer chains.

14. Quantum random address memory apparatus comprising:

a plurality of address ports providing a low dimensional plurality of addresses;

a plurality of nano-memory elements pseudo-randomly placed on a support structure;

pseudo-randomly positioned, non-linear mixer elements coupling the address ports to a high dimensional plurality of the plurality of nano-memory elements;

comparison structure coupled to the plurality of nano-memory elements for detecting a read-out pattern of the plurality of nano-memory elements for each address applied to the plurality of address ports; and data output ports coupled to the comparison structure for providing an output signal for each address applied to the plurality of address ports, wherein the high dimensional plurality of nano-memory elements is greater than the low dimensional plurality of addresses by a number resulting in substantially error free memory recalls.

15. Quantum random address memory apparatus as claimed in claim 14 wherein the high dimensional plurality of nano-memory elements is greater than the low dimensional plurality of addresses by at least a factor of 40.

16. Quantum random address memory apparatus as claimed in claim 14 wherein the nano-memory elements each include one of quantum dots, magnetic tunneling junctions, and resistors.

17. Quantum random address memory apparatus as claimed in claim 14 wherein the mixer elements each include one of pseudo-randomly placed nano-diodes and self-assembled conductive polymer chains.

18. Quantum random address memory apparatus as claimed in claim 14 wherein the address ports include parallel spaced apart conductive strips, one strip for each of the address ports and the comparison structure includes a pair of spaced apart electrical conductors extending transverse to the parallel spaced apart strips with each electrical conductor coupled to a different approximately one half of the plurality of nano-memory elements.

19. Quantum random address memory apparatus as claimed in claim 18 wherein the comparison structure includes circuitry coupled to the pair of spaced apart electrical conductors for comparing the electrical signals at each of the pair of spaced apart electrical conductors.

20. Quantum random address memory apparatus as claimed in claim 19 wherein the circuitry for comparing the electrical signals includes differential amplifier.

21. Quantum random address memory apparatus as claimed in claim 14 wherein the comparison structure includes a piezo layer with the plurality of nano-memory elements positioned thereon.

22. Quantum random address memory apparatus as claimed in claim 14 wherein the plurality of pseudo-randomly positioned, non-linear mixer elements include a plurality of pseudo-random electrical conductors and a plurality of pseudo-random nano-diodes positioned to pseudo-randomly couple the plurality of address ports to the plurality of nano-memory elements.

23. Quantum random address memory apparatus as claimed in claim 22 wherein the plurality of nano-memory elements include adaptive nano-resistors.

24. Quantum random address memory apparatus as claimed in claim 22 wherein the plurality of pseudo-random electrical conductors includes self-assembled conductive polymer chains.

* * * * *